(12) United States Patent
Je et al.

(10) Patent No.: US 11,901,907 B2
(45) Date of Patent: Feb. 13, 2024

(54) ELECTRONIC DEVICE AND METHOD OF OPERATING THE SAME

(71) Applicant: SK hynix Inc., Icheon-si (KR)

(72) Inventors: Sang Eun Je, Icheon-si (KR); Ki Young Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 173 days.

(21) Appl. No.: 17/521,603

(22) Filed: Nov. 8, 2021

(65) Prior Publication Data
US 2022/0385295 A1    Dec. 1, 2022

(30) Foreign Application Priority Data
May 26, 2021    (KR) .................. 10-2021-0067928

(51) Int. Cl.
*H03M 1/00* (2006.01)
*G11C 13/00* (2006.01)
*G06N 3/065* (2023.01)

(52) U.S. Cl.
CPC .......... *H03M 1/002* (2013.01); *G06N 3/065* (2023.01); *G11C 13/003* (2013.01)

(58) Field of Classification Search
CPC ...... H03M 1/1215; H03M 1/002; H03M 1/12; H03M 1/1225; H03M 1/0673; H03M 1/361; H03M 1/14; H03M 1/123; H03M 1/56; H03M 1/00; H03M 1/007; H03M 1/1033;
(Continued)

(56) References Cited

U.S. PATENT DOCUMENTS 4,912,470 A * 3/1990 Hosotani ............. H03M 1/0602
341/159
4,926,180 A    5/1990 Anastassiou
(Continued)

OTHER PUBLICATIONS

Leibin, N. et al., "An Energy-efficient Matrix Multiplication Accelerator by Distributed In-memory Computing on Binary RRAM Crossbar", Asia and South Pacific Design Automation Conference (ASP-DAC), IEEE, Jan. 2016, pp. 280-285.

*Primary Examiner* — Linh V Nguyen
(74) *Attorney, Agent, or Firm* — Perkins Coie LLP

(57) ABSTRACT

An electronic device includes analog-to-digital converters each configured to receive an analog input signal and output a digital output signal corresponding to the analog input signal, an analog input signal generator configured to generate analog input signals provided to each analog-to-digital converter based on input voltages and weight data, an input signal distribution information generator configured to generate input signal distribution information indicating a distribution of the analog input signals for each of the analog-to-digital converters, an analog-to-digital converter group classifier configured to classify the analog-to-digital converters into a plurality of first analog-to-digital converter groups based on the input signal distribution information, and an analog-to-digital converter input range optimizer configured to determine an input range of each first analog-to-digital converter group based on the input signal distribution information, and each analog-to-digital converter is configured to operate according to an input range of a corresponding first analog-to-digital converter groups.

20 Claims, 12 Drawing Sheets

(58) Field of Classification Search
CPC ........ H03M 1/121; H03M 1/36; H03M 1/004;
H03M 3/452; H03M 1/188
USPC .................................. 341/141, 155, 159
See application file for complete search history.

(56) References Cited

U.S. PATENT DOCUMENTS

| | | | | |
|---|---|---|---|---|
| 5,099,240 | A * | 3/1992 | Nakatani | H03M 1/069 |
| | | | | 341/158 |
| 6,246,352 | B1 * | 6/2001 | Fattaruso | H03M 1/145 |
| | | | | 341/154 |
| 6,445,329 | B1 * | 9/2002 | Abassi | H03M 1/145 |
| | | | | 341/122 |
| 8,760,335 | B1 * | 6/2014 | Kappes | H03M 1/12 |
| | | | | 341/155 |
| 9,887,702 | B1 * | 2/2018 | Miglani | H03M 1/0673 |
| 9,935,649 | B1 * | 4/2018 | Thomsen | H03M 3/452 |
| 9,998,134 | B1 * | 6/2018 | Stepanovic | H03M 1/1014 |
| 10,380,386 | B1 | 8/2019 | Strachan et al. | |
| 2018/0063457 | A1 * | 3/2018 | Shimamura | H03M 1/56 |
| 2020/0312406 | A1 * | 10/2020 | Sharma | G11C 11/54 |
| 2020/0356843 | A1 * | 11/2020 | Strachan | G11C 7/1012 |
| 2022/0083846 | A1 * | 3/2022 | Berdan | H03M 1/56 |

\* cited by examiner

FIG. 4
330
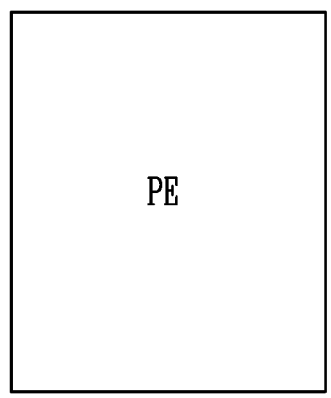 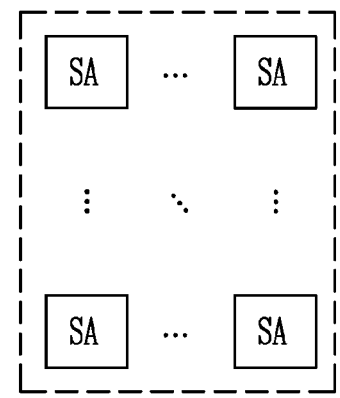
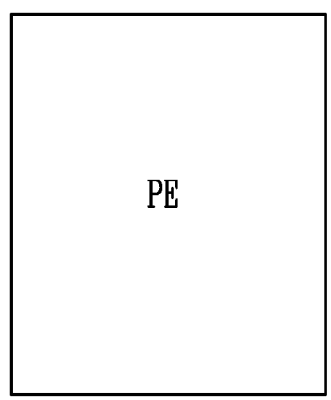 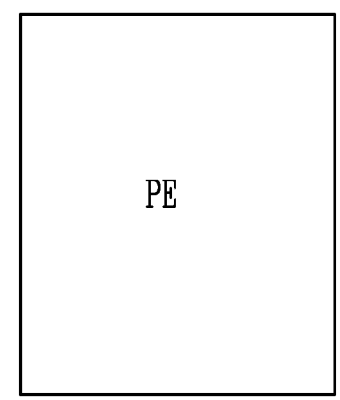

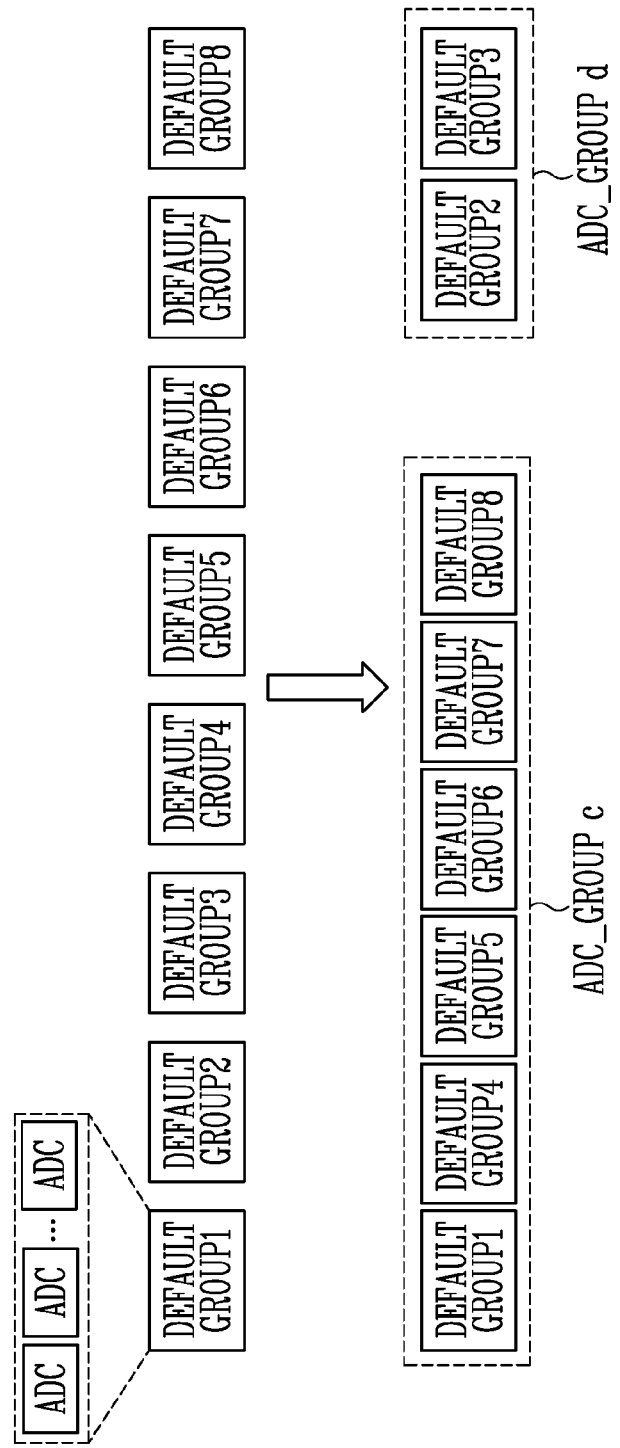

ELECTRONIC DEVICE AND METHOD OF OPERATING THE SAME

CROSS-REFERENCE TO RELATED APPLICATION

This patent document claims the priority and benefits of the Korean patent application number 10-2021-0067928, filed May 26, 2021, which is incorporated herein by reference in its entirety.

TECHNICAL FIELD

The technology disclosed in this patent document relates to an electronic device and a method of operating the same.

BACKGROUND

A neural network refers to a computational architecture obtained by modeling a biological brain. As a neural network technology is developed recently, research for extracting valid information from input data based on one or more neural network models in various types of electronic systems is being actively conducted. A convolution operation occupies a significant portion of operations required in a neural network model.

SUMMARY

An embodiment of the disclosed technology provides an electronic device and a method of operating the same capable of reducing the area and power consumption of an analog-to-digital converter while increasing accuracy of a neural network model including the analog-to-digital converter.

According to an embodiment of the disclosed technology, an electronic device includes a plurality of analog-to-digital converters each configured to receive an analog input signal and output a digital output signal corresponding to the analog input signal, an analog input signal generator configured to generate analog input signals provided to each of the plurality of analog-to-digital converters based on an operation on a plurality of input voltages and a plurality of weight data, an input signal distribution information generator configured to generate input signal distribution information indicating a distribution of the analog input signals for each of the plurality of analog-to-digital converters, an analog-to-digital converter group classifier configured to classify the plurality of analog-to-digital converters into a plurality of first analog-to-digital converter groups based on the input signal distribution information of the plurality of analog-to-digital converters, and an analog-to-digital converter input range optimizer configured to determine an input range of each of the plurality of first analog-to-digital converter groups based on the input signal distribution information of the plurality of analog-to-digital converters, and each of the plurality of analog-to-digital converters is configured to operate according to an input range of a corresponding first analog-to-digital converter group among the plurality of first analog-to-digital converter groups.

According to an embodiment of the disclosed technology, a method of operating an electronic device includes classifying a plurality of analog-to-digital converters into a plurality of default analog-to-digital converter groups, generating analog input signals for the plurality of analog-to-digital converters using an operation based on a plurality of input voltages and a plurality of weight data, generating input signal distribution information of the plurality of default analog-to-digital converter groups based on the analog input signals, classifying the plurality of default analog-to-digital converter groups into a plurality of first analog-to-digital converter groups based on the input signal distribution information of the plurality of default analog-to-digital converter groups, determining an input range of each of the plurality of first analog-to-digital converter groups based on the input signal distribution information of the plurality of default analog-to-digital converter groups, and controlling the plurality of analog-to-digital converters to operate according to an input range of a corresponding first analog-to-digital converter group among the plurality of first analog-to-digital converter groups.

According to the present technology, an electronic device and a method of operating the same is provided, which are capable of reducing the area and power consumption of an analog-to-digital converter while increasing accuracy of a neural network model including the analog-to-digital converter are provided.

BRIEF DESCRIPTION OF THE DRAWINGS

FIG. 4 is a diagram illustrating a computing circuit according to an embodiment of the disclosed technology.

FIG. 7B is a diagram illustrating an operation of classifying a plurality of default analog-to-digital converter groups into a plurality of first analog-to-digital converter groups according to an embodiment of the disclosed technology.

DETAILED DESCRIPTION

Figure 1:
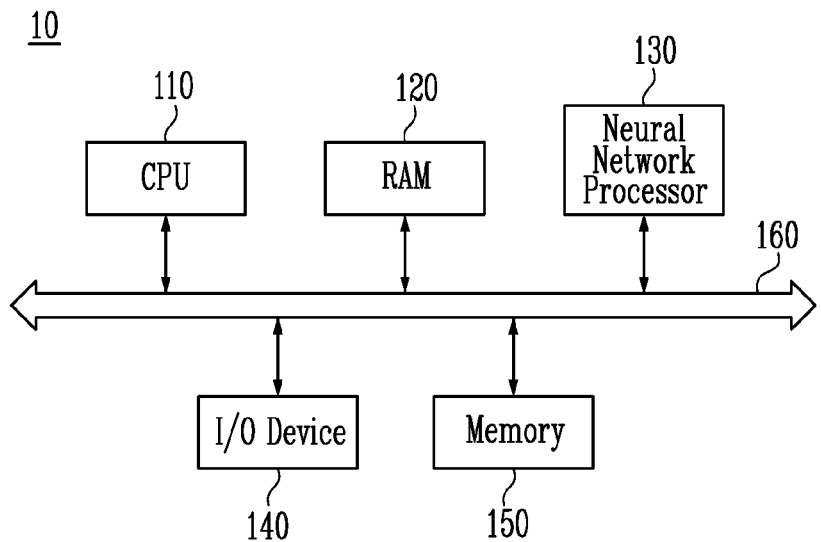
FIG. 1 is a diagram illustrating an example of a computing system according to an embodiment of the disclosed technology.

FIG. 1 is a diagram illustrating an example of a computing system according to an embodiment of the disclosed technology.

Referring to FIG. 1, the computing system 10 may extract valid information by analyzing input data in real time based on a neural network, and determine a situation based on the extracted information or control configurations of an electronic device on which the computing system 10 is mounted. For example, the computing system 10 may be applied to a drone, an advanced driver assistance system (ADAS), a smart TV, a smart phone, a medical device, a mobile device, an image display device, a measurement device, an Internet of things (IoT) device, or others, and may be mounted on one of various types of electronic devices.

The computing system 10 may include a central processing unit (CPU) 110, a random access memory (RAM) 120, a neural network processor 130, an input/output device 140, and a memory 150. In addition, the computing system 10 may further include other general-purpose components such as a multi-format codec (MFC), a video module (for example, a camera interface, a joint photographic experts group (JPEG) processor, a video processor, a mixer, or the like), a 3D graphics core, an audio system, a display driver, a graphic processing unit (GPU), and a digital signal processor (DSP). The CPU 110, the RAM 120, the neural network processor 130, the input/output device 140, and the memory 150 may transmit/receive data through a communication bus 160.

In an embodiment, the components of the computing system 10, the CPU 110, the RAM 120, the neural network processor 130, the input/output device 140, and the memory 150 may be implemented as one semiconductor chip, and for example, the computing system 10 may be implemented as a system on a chip (SoC). However, the disclosed technology is not limited thereto, and the computing system 10 may be implemented as a plurality of semiconductor chips. In an embodiment, the computing system 10 may be an application processor mounted on a mobile device.

The CPU 110 may control an overall operation of the computing system 10. The CPU 110 may include one core (single core) or a plurality of cores (multi-core). The CPU 110 may process or execute programs and/or data stored in the RAM 120 and the memory 150. For example, the CPU 110 may control functions of the computing system 10 by executing the programs stored in the memory 150.

The RAM 120 may temporarily store programs, data, or instructions. For example, the programs and/or the data stored in the memory 150 may be temporarily loaded into the RAM 120 according to control or a booting code of the CPU 110. The RAM 120 may be implemented using a memory such as a dynamic RAM (DRAM) or a static RAM (SRAM).

The input/output device 140 may receive a user input or input data from an outside, and may output a data processing result of the computing system 10. The input/output device 140 may be implemented as a touch screen panel, a keyboard, various types of sensors, or others. In an embodiment, the input/output device 140 may collect information around the computing system 10. For example, the input/output device 140 may include at least one of various types of sensing devices such as an imaging device, an image sensor, a light detection and ranging (LIDAR) sensor, an ultrasonic sensor, or an infrared sensor, or receive a sensing signal from the device.

The memory 150 may be a storage place for storing data, and may store, for example, an operating system (OS), various programs, and various data. The memory 150 may be a DRAM, but is not limited thereto. The memory 150 may include at least one of a volatile memory and a non-volatile memory. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or others. The volatile memory may include a dynamic RAM (DRAM), a static RAM (SRAM), a synchronous DRAM (SDRAM), or others. In addition, in an embodiment, the memory 150 may be implemented as a storage device such as a hard disk drive (HDD), a solid-state drive (SSD), a compact flash (CF), a secure digital (SD), a micro SD, a mini SD, an extreme digital (xD), or a memory stick.

The neural network processor 130 may generate a neural network, train (or learn) the neural network, or perform an operation based on received input data, and may generate an information signal based on an operation result or retrain the neural network. The neural network may include various types of neural network models such as a convolution neural network (CNN), a region with convolution neural network (R-CNN), a region proposal network (RPN), a recurrent neural network (RNN), a deep neural network (DNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, or a classification network. The neural network as mentioned above is an example only and is not limited thereto. A configuration of a neural network is exemplarily described with reference to FIGS. 2A and 2B.

Figure 2A:
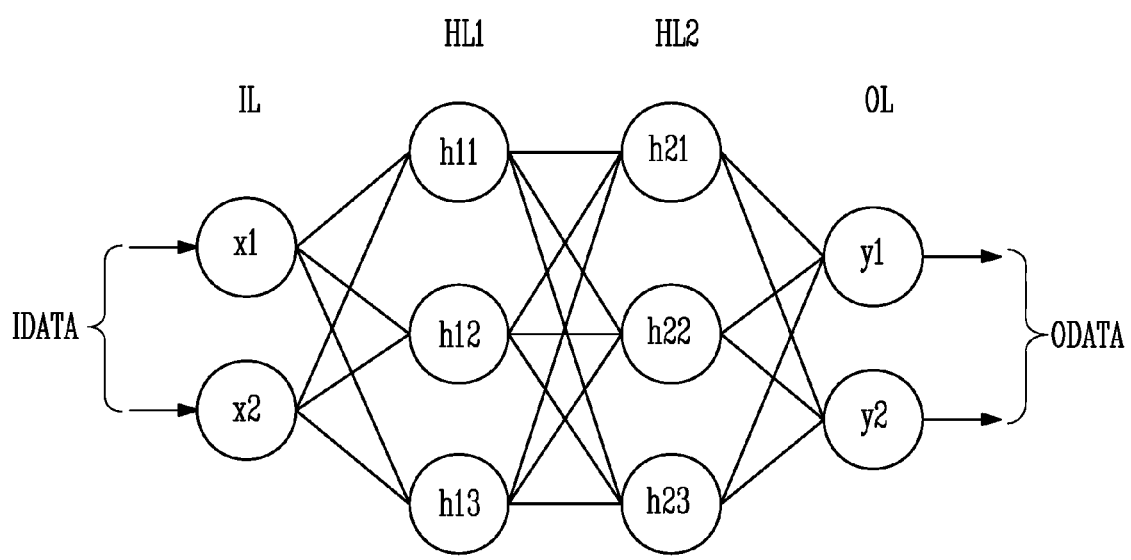
FIGS. 2A and 2B are diagrams illustrating a configuration of a neural network according to an embodiment of the disclosed technology.
Figure 2B:
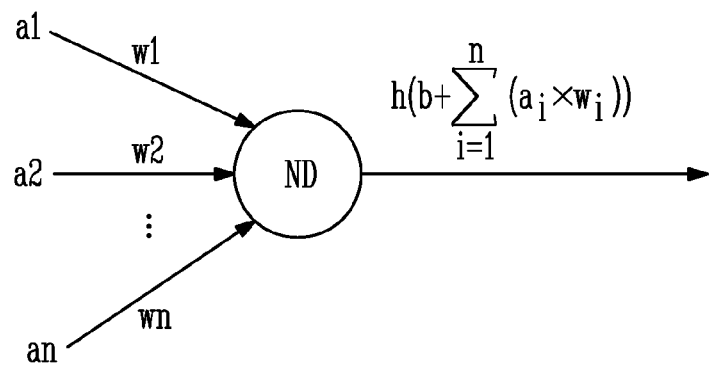

FIGS. 2A and 2B are diagrams illustrating a configuration of a neural network according to an embodiment of the disclosed technology.

Referring to FIG. 2A, the neural network may include an input layer IL, a plurality of hidden layers HL1 and HL2, and an output layer OL. In FIG. 2A, the number of hidden layers is two, the number of hidden layers may be various according to an embodiment.

The input layer IL may include input nodes x1 and x2, and input data IDAT may be input to each input node. Meanwhile, the number of input nodes included in the input layer may be various according to an embodiment.

The plurality of hidden layers HL1 and HL2 may include hidden nodes h11, h12, h13, h21, h22, and h23. For example, the hidden layer HL1 may include a plurality of hidden nodes h11, h12, and h13, and the hidden layer HL2 may include a plurality of hidden nodes h21, h22, and h23. Meanwhile, the number of hidden nodes included in each hidden layer is not limited to three, and may be various according to an embodiment.

The output layer OL may include output nodes y1 and y2, and may output a result of input data IDAT as output data ODAT. Meanwhile, the number of output nodes included in the output layer may be various according to an embodiment.

The network structure shown in FIG. 2A may include a branch between nodes shown as a straight line between two nodes, and a weight used in each connection, although not shown. At this time, nodes in one layer may not be connected, and nodes included in different layers may be completely or partially connected.

Each node (for example, h11) of FIG. 2A may receive an output of a previous node (for example, x1) and perform an operation, and may output an operation result to a subsequent node (for example, h21). At this time, each node may operate a value to be output by applying an input value to a specific function, for example, a nonlinear function.

In general, the structure of the neural network may be predetermined, and weights according to the connection between the nodes may calculate an appropriate value using data of which a correct answer is already known. As described above, the data of which the correct answer is already known is referred to as 'learning data', and a process of determining the weight is referred to as 'learning'. In addition, it is assumed that a group of an independently learnable structure and the weight is a 'model', and a process in which a model of which a weight is determined predicts which class the input data belongs to and outputs a predicted value may be referred to as a 'test process'.

Referring to FIG. 2B, an example of an operation performed in one node ND among the nodes shown in FIG. 2A is specifically illustrated. It is assumed that n inputs a1, a2, . . . , and an are provided in one node ND.

In an embodiment, the node ND may multiply n inputs a1, a2, a3, . . . , and an and corresponding n weights w1, w2, w3, . . . , and wn, respectively, sum values obtained by the multiplication, add bias (b) to the summed input value, and apply the input value on which the bias is reflected to a specific function ($\sigma$), to generate one output value. At this time, the specific function ($\sigma$) may be an activation function.

When one layer included in the neural network shown in FIG. 2A includes M nodes ND shown in FIG. 2B, output values of one layer may be obtained as in [Equation 1] below.

$$WA=Z \quad \text{[Equation 1]}$$

In [Equation 1], W represents a weight for all connections included in one layer, and may be implemented in a form of an M×N matrix. A represents n inputs a1, a2, a3, . . . , and an received in one layer, and may be implemented in a form of an n×1 matrix. Z represents m outputs z1, z2, z3, . . . , and zm output from one layer, and may be implemented in a form of an m×1 matrix.

Figure 3:
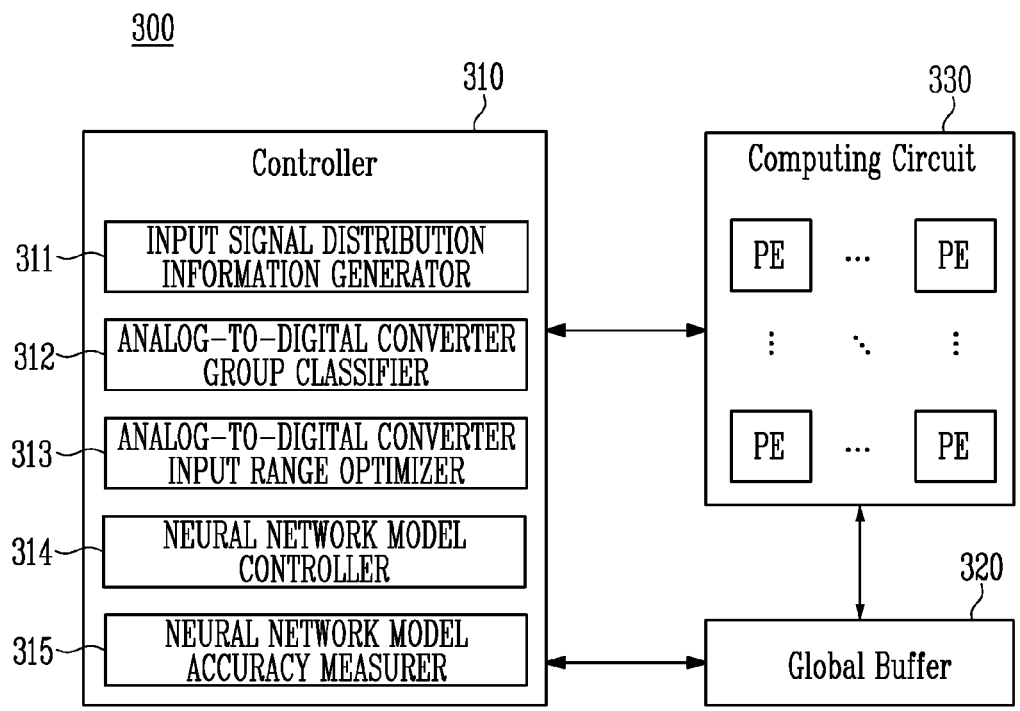
FIG. 3 is a diagram illustrating an electronic device for optimizing an input range of an analog-to-digital converter according to an embodiment of the disclosed technology.

FIG. 3 is a diagram illustrating an electronic device for optimizing an input range of an analog-to-digital converter according to an embodiment of the disclosed technology. In the disclosed technology, an analog-digital converter (ADC) is used to implement the neural network model. While the conventional ADC occupies a large area and its power consumption is large, some implementations of the disclosed technology provide an electronic device that can reduce an area and power consumption of an ADC while increasing accuracy of a neural network model.

In an embodiment, the electronic device 300 shown in FIG. 3 may be implemented as one configuration of the neural network processor 130 shown in FIG. 1. For example, the electronic device 300 may optimize the input range of the plurality of analog-to-digital converters included in a computing circuit 330. At this time, the input range may indicate a maximum dynamic range that prevents the analog-to-digital converter from being overloaded. The "input range" may be also referred to as a "quantization range".

Referring to FIG. 3, the electronic device 300 may include a controller 310, a global buffer 320, and the computing circuit 330. In an embodiment, the controller 310, the global buffer 320, and the computing circuit 330 may communicate through a communication bus.

In an embodiment, the electronic device 300 may be implemented as one single semiconductor chip. For example, the electronic device 300 may be implemented as a system on chip (SoC). However, the disclosed technology is not limited thereto, and the electronic device 300 may be implemented with a plurality of semiconductor chips.

The controller 310 may control an overall operation of the electronic device 300. The controller 310 may control operations of the global buffer 320 and the computing circuit 330. For example, the controller 310 may set and manage parameters related to a neural network operation, for example, a convolution operation, so that the computing circuit 330 may normally execute the layers of the neural network.

The controller 310 may be implemented as hardware, software (or firmware), or a combination of hardware and software. In an embodiment, the controller 310 may be implemented with a hardware logic designed to perform the above-described functions. In an embodiment, the controller 310 may be implemented with at least one processor, for example, a CPU, a microprocessor, or others, and may execute a program including instructions configuring the above-described functions.

In an embodiment, the controller 310 may include an input signal distribution information generator 311, an analog-to-digital converter group classifier 312, an analog-to-digital converter input range optimizer 313, a neural network model controller 314, and a neural network model accuracy measurer 315.

The input signal distribution information generator 311 may generate input signal distribution information for each of the plurality of analog-to-digital converters. At this time, the input signal distribution information may indicate a distribution of analog input signals.

In an embodiment, the input signal distribution information generator 311 may generate the input signal distribution information of the plurality of analog-to-digital converters based on analog input signals input to each of the plurality of analog-to-digital converters. For example, the input signal distribution information generator 311 may receive the analog input signals input to each of the plurality of analog-to-digital converters from the computing circuit 330. The input signal distribution information generator 311 may calculate an average and a standard deviation of the analog input signals. In addition, the input signal distribution information generator 311 may generate the input signal distribution information of the plurality of analog-to-digital converters using the average and the standard deviation.

In an embodiment, the input signal distribution information generator 311 may generate the input signal distribution information of the plurality of analog-to-digital converters using a 3 sigma technique. The 3 sigma technique is described in detail with reference to FIG. 6.

The analog-to-digital converter group classifier 312 may classify the plurality of analog-to-digital converters into a plurality of first analog-to-digital converter groups based on the input signal distribution information of the plurality of analog-to-digital converters.

In an embodiment, the analog-to-digital converter group classifier 312 may determine analog-to-digital converters having similar size values corresponding to the input signal distribution information as any one first analog-to-digital group among the plurality of first analog-to-digital groups.

In an embodiment, the size value corresponding to the input signal distribution information may indicate an addition of the average and a multiple of the standard deviation of the analog input signals.

For example, the analog-to-digital converter group classifier 312 may classify the plurality of analog-to-digital converters into the plurality of first analog-to-digital converter groups using a clustering technique. The analog-to-digital converter group classifier 312 may determine a size value corresponding to the input signal distribution information as a point of the analog-to-digital converter having the corresponding input signal distribution information. The analog-to-digital converter group classifier 312 may configure the plurality of first analog-to-digital converter groups by determining analog-to-digital converters having a close distance between points as one first analog-to-digital converter group. Thus, the analog-to-digital converter group classifier 312 may use the size value corresponding to the input signal distribution information as a variable and determine analog-to-digital converters having similar variables as the first analog-to-digital converter group.

In an embodiment, the clustering technique may be used to classify data into a plurality of groups based on a concept of similarity or others. At this time, clustering may be referred to as grouping, and a group may be referred to as a cluster. The clustering technique may allow to define a group based on a characteristic or others of data and classify data having similar characteristics into the same group. Therefore, data having similar characteristics may belong to the same group, and data having different characteristics may belong to different clusters.

For example, the analog-to-digital converter group classifier 312 may classify the plurality of analog-to-digital converters into the plurality of first analog-to-digital converter groups using a k-average clustering technique. The k-average clustering technique may be an algorithm for classifying a classification object into k clusters. Therefore, the analog-to-digital converter group classifier 312 may classify the plurality of analog-to-digital converters into k first analog-to-digital converter groups using the k-average clustering technique. At this time, k may be set in various manners and may be increased by an operation of increasing the number of groups to be configured with a plurality of analog-to-digital converters, which will be described later. In the above-described example, the plurality of analog-to-digital converters are classified into the plurality of first analog-to-digital converter groups using the k-average clustering technique, but other implementations are also possible. Therefore, other clustering technique than the k-average clustering technique can be applied to classify the plurality of analog-to-digital converters into the plurality of first analog-to-digital converter groups.

The analog-to-digital converter input range optimizer 313 may optimize the input range of the plurality of analog-to-digital converters.

In an embodiment, the analog-to-digital converter input range optimizer 313 may determine the input range of each of the plurality of first analog-to-digital converter groups based on the input signal distribution information of the plurality of analog-to-digital converters. In this case, each of the plurality of analog-to-digital converters may operate according to an input range of a corresponding first analog-to-digital converter group among the plurality of first analog-to-digital converter groups. For example, the analog-to-digital converter input range optimizer 313 may determine any one of analog-to-digital converters included in each of the plurality of first analog-to-digital converter groups as a reference analog-to-digital converter in each of the plurality of first analog-to-digital converter groups. At this time, the reference analog-to-digital converter may be an analog-to-digital converter having the largest size value corresponding to the input signal distribution information among the analog-to-digital converters included in each of the plurality of first analog-to-digital converter groups. In addition, the analog-to-digital converter input range optimizer 313 may determine a distribution range corresponding to the input signal distribution information of the reference analog-to-digital converter determined in each of the plurality of first analog-to-digital converter groups as the input range of each of the plurality of first analog-to-digital converter groups. In an embodiment, the distribution range corresponding to the input signal distribution information may indicate a range formed by the average and the multiple of the standard deviation of the analog input signals.

The neural network model controller 314 may control the neural network model to output a result of the input data. For example, the neural network model control unit 314 may obtain the output value for the input data by using the neural network model including the plurality of analog-to-digital converters operating according to the input range optimized by the analog-to-digital converter input range optimizer 313. The output value may mean a result of the neural network model for the input data, and a form of the output value may be various according to a type of the neural network model.

In an embodiment, the neural network model may be implemented using the electronic device 300. For example, the plurality of layers included in the neural network model may be implemented using a plurality of processing elements PE or a plurality of sub arrays included in the computing circuit 330. Therefore, operations of the neural network model may be performed through the computing circuit 330. In this case, the computing circuit 330 may include the plurality of analog-to-digital converters operating according to the optimized input range. Thus, the neural network model is applied to optimize the input range of each of the plurality of analog-to-digital converters. In some implementations, the input range of each of the plurality of analog-to-digital converters may be optimized according to the input range of the corresponding first analog-to-digital converter group. The electronic device 300 implements the neural network model by including the plurality of analog-to-digital converters operating according to the optimized input range.

In an embodiment, the neural network model controller 314 may output the result of the input data using the neural network model including the plurality of analog-to-digital converters operating according to the optimized input range. For example, the neural network model controller 314 may provide the input data and weight data to the global buffer 320 and the computing circuit 330, and control the global buffer 320 and the computing circuit 330 to output the output value for the input data. Thereafter, the neural network model controller 314 may obtain the output value from the global buffer 320 and the computing circuit 330.

The neural network model accuracy measurer 315 may measure the accuracy of the neural network model based on the output value of the neural network model. For example, the neural network model accuracy measurer 315 may measure the accuracy of the neural network model based on a result of comparing the output value with target data corresponding to the input data. At this time, the target data may be data indicating a correct answer to the input data. In some implementations, the neural network model controller 314 may obtain a plurality of output values for a plurality of input data. The neural network model accuracy measurer 315 may compare a plurality of target data corresponding to the plurality of input data and the plurality of output values, and may determine whether each of the plurality of output values is a correct answer. The neural network model accuracy measurer 315 may determine a ratio of the number of output values determined as the correct answer to the number of output values that are not the correct answer as the accuracy of the neural network model. A method of measuring the accuracy of the neural network model described above is only an example, and other implementations are also possible. Thus, the method of measuring the accuracy of the neural network model may be implemented in various manners.

In an embodiment, when the accuracy of the neural network model is less than a preset threshold value, the electronic device 300 may perform again the operation of classifying the plurality of analog-to-digital converters and the operation of determining the input range.

For example, when the accuracy of the neural network model is less than the preset threshold value, the analog-to-digital converter group classifier 312 may increase the number of groups to be configured of the plurality of analog-to-digital converters or the number of output bits of the plurality of analog-to-digital converters. At this time, the number of output bits may indicate the number of bits that represent the analog input signal. In an embodiment, the "number of output bits" may be referred to as the "number of quantization bits". Thereafter, the analog-to-digital converter group classifier 312 may reclassify the plurality of analog-to-digital converters into a plurality of second analog-to-digital converter groups according to the increased number of groups or the increased number of output bits. The first analog-to-digital converter group may be a group before reclassification, and the second analog-to-digital converter group may be a reclassified group. In an embodiment, the analog-to-digital converter group classifier 312 may reclassify the plurality of analog-to-digital converters into the plurality of second analog-to-digital converter groups while increasing the number of groups. When the number of groups does not increase any longer, the analog-to-digital converter group classifier 312 may reclassify the plurality of analog-to-digital converters into the plurality of second analog-to-digital converter groups while increasing the number of output bits. In addition, the analog-to-digital converter input range optimizer 313 may determine the input range of each of the plurality of second analog-to-digital converter groups based on the input signal distribution information of the plurality of analog-to-digital converters. In this case, each of the plurality of analog-to-digital converters may operate according to an input range of a corresponding second analog-to-digital converter group among the plurality of second analog-to-digital converter groups. Thus, the electronic device 300 can repeat the operation of classifying the analog-to-digital converters and the operation of determining the input range until the accuracy of the neural network model is equal to or greater than the preset threshold value.

In an embodiment, the electronic device 300 may classify the plurality of analog-to-digital converters into a plurality of default analog-to-digital groups, and then classify the plurality of default analog-to-digital groups into a plurality of first analog-to-digital converter groups.

For example, the analog-to-digital converter group classifier 312 may classify the plurality of analog-to-digital converters into the plurality of default analog-to-digital converter groups according to a preset unit. At this time, each of the plurality of default analog-to-digital converter groups may correspond to a layer unit or a hardware unit. For example, the analog-to-digital converter group classifier 312 may determine analog-to-digital converters included in one layer as the default analog-to-digital converter group. As another example, the analog-to-digital converter group classifier 312 may determine analog-to-digital converters included in one processing element PE as the default analog-to-digital converter group. As still another example, the analog-to-digital converter group classifier 312 may determine analog-to-digital converters included in one sub array as the default analog-to-digital converter group. However, this is only an example, and the unit to which the plurality of default analog-to-digital converter groups correspond may be various.

Thereafter, the input signal distribution information generator 311 may generate input signal distribution information of the plurality of default analog-to-digital converter groups based on analog input signals input to the analog-to-digital converters included in each of the plurality of default analog-to-digital converter groups. For example, the input signal distribution information of each default analog-to-digital converter group may indicate a distribution of the analog input signals input to the analog-to-digital converters included in each default analog-to-digital converter group. The analog-to-digital converter group classifier 312 may classify the plurality of default analog-to-digital converter groups into the plurality of first analog-to-digital converter groups based on the input signal distribution information of the plurality of default analog-to-digital converter groups. In addition, the analog-to-digital converter input range optimizer 313 may determine the input range of each of the plurality of first analog-to-digital converter groups based on the input signal distribution information of the plurality of default analog-to-digital converter groups.

Thus, the electronic device 300 may apply the operation of classifying the plurality of analog-to-digital converters and the operation of determining the input range, which have been described for the plurality of analog-to-digital converters, to the plurality of default analog-to-digital groups as well.

The global buffer 320 may store the weight data. The stored weight data may be provided to the computing circuit 330. In addition, when the weight data is updated, the global buffer 320 may store the updated weight data and provide the updated weight data to the computing circuit 330.

The global buffer 320 may be implemented with a random access memory (RAM), for example, a dynamic RAM (DRAM), an SRAM, or others.

The computing circuit 330 may include the plurality of processing elements PE. The computing circuit 330 may perform a convolution operation, for example, an element-wise multiply-accumulate (MAC) operation. The plurality of processing elements PE, for example, an analog input signal generator, may perform the MAC operation on the input data and the weight data. The computing circuit 330 may provide a result of the MAC operation to the global buffer 320 or the controller 310.

In an embodiment, the computing circuit 330 may generate the analog input signals input to each of the plurality of analog-to-digital converters. For example, the computing circuit 330 may perform the MAC operation on the plurality of input voltages corresponding to the input data and the plurality of weight data. The computing circuit 330 may output a plurality of output currents as a result of the MAC operation, and convert the plurality of output currents into the analog input signals. Thereafter, the computing circuit 330 may provide the analog input signals to the global buffer 320 or the controller 310. In addition, the computing circuit 330 may output digital output signals corresponding to the analog input signals using the plurality of analog-to-digital converters. At this time, the plurality of analog-to-digital converters may operate according to the optimized input range.

In an embodiment, the computing circuit 330 may perform operations of the neural network model through the MAC operation on the input data and the weight data, the conversion from the output current to the analog input signal, and the conversion from the analog input signal to the digital output signal described above. Therefore, the result of the neural network model for the input data may be indicated as a value finally output through the MAC operation on the input data and the weight data, the conversion from the output current to the analog input signal, and the conversion from the analog input signal to the digital output signal described above Therefore, according to an embodiment of the disclosed technology, an area occupied by the analog-to-digital converter and power consumption may be reduced by using a low-resolution analog-to-digital converter. In addition, according to an embodiment of the disclosed technology, the accuracy of the neural network model may be increased while using the low-resolution analog-to-digital converter.

FIG. 4 is a diagram illustrating a computing circuit according to an embodiment of the disclosed technology.

Referring to FIG. 4, the computing circuit 330 may include the plurality of processing elements PE. The plurality of processing elements PE may perform the MAC operation on the input data and the weight data. For example, the plurality of processing elements PE may operate independently and simultaneously perform the MAC operation. Therefore, the MAC operations on the plurality of input data may be performed in parallel. In an embodiment, one layer included in the neural network may be implemented by one processing element PE.

In an embodiment, each of the plurality of processing devices PE may include a plurality of sub arrays SA. The plurality of sub arrays SA may perform the MAC operation on the input data and the weight data. For example, the plurality of sub arrays SA may operate independently and simultaneously perform the MAC operation. Therefore, the MAC operation on the plurality of input data may be performed in parallel. In an embodiment, one layer included in the neural network may be implemented by one processing element PE or one sub array SA.

Figure 5A:
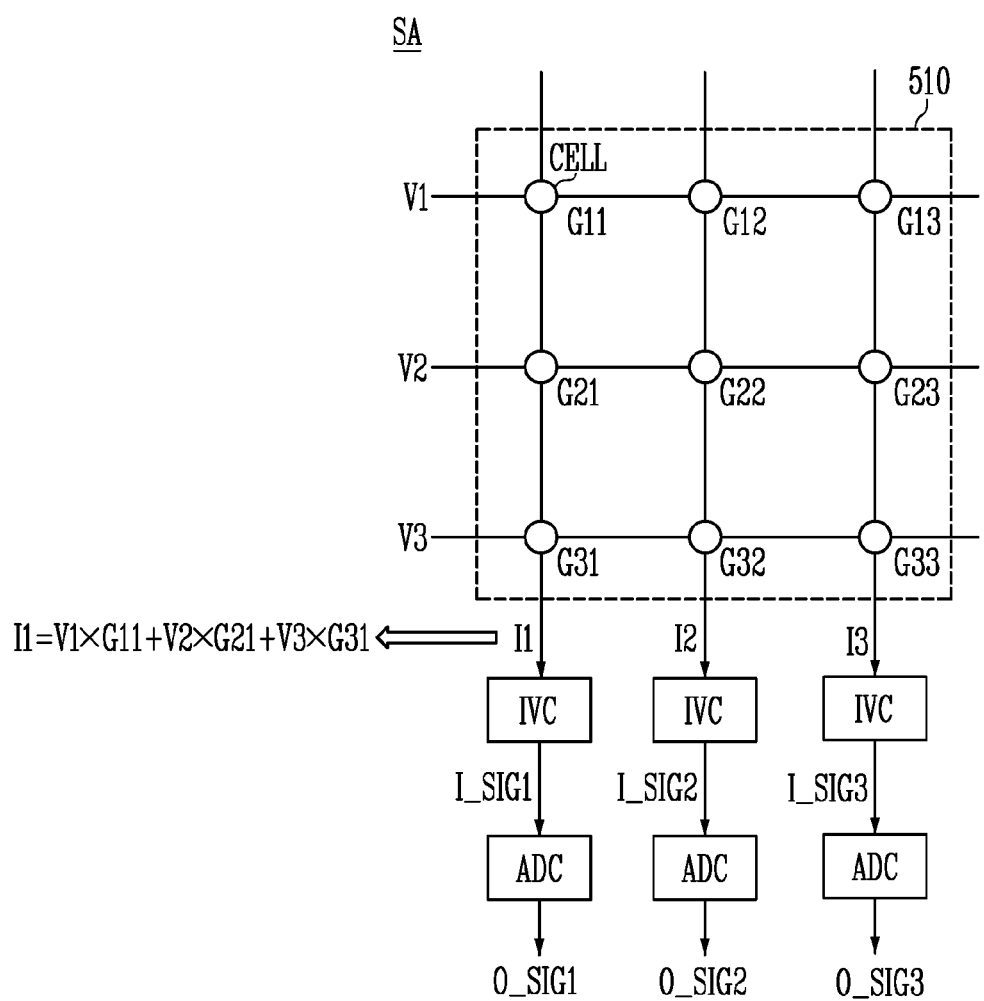
FIG. 5A is a diagram illustrating an example of a sub array according to an embodiment of the disclosed technology.

FIG. 5A is a diagram illustrating an example of a sub array according to an embodiment of the disclosed technology.

Referring to FIG. 5A, the sub array SA may include a crossbar array 510, a plurality of current-to-voltage converters (IVCs), and a plurality of analog-to-digital converters (ADCs).

The crossbar array 510 includes a plurality of resistive memory cells CELL each including a resistive element and arranged in a matrix form. In an embodiment, the resistive element may be implemented as a memristor. A resistance value of the resistive element may be changed according to an applied voltage, and the plurality of resistive memory cells CELL may store data using a resistance change.

In an embodiment, each resistive memory cell CELL may be implemented by including a random resistive memory cell such as a phase change random access memory (PRAM) cell, a resistance random access memory (RRAM) cell, a magnetic random access memory (MRAM) cell, or a ferroelectric random access memory (FRAM) cell. Each of the plurality of resistive memory cells CELL may be connected to one of a plurality of rows and one of a plurality of columns.

The crossbar array 510 stores a plurality of weight data. At this time, the plurality of weight data may correspond to conductances G11, G12, G13, G21, G22, G23, G31, G32, and G33 of the plurality of resistive memory cells CELL. For example, the plurality of weight data may be stored in the plurality of resistive memory cells CELL by using the resistance change of the resistive element included in each of the plurality of resistive memory cells CELL. In addition, the crossbar array 510 may be configured to perform the multiply-accumulate (MAC) operation on the plurality of input voltages V1, V2, and V3 and the plurality of weight data. The crossbar array 510 may include a structure to perform the MAC operation. The crossbar array 510 may output a plurality of output currents I1, I2, and I3 according to a results of the MAC operation. For example, the plurality of input voltages V1, V2, and V3 may be input to the crossbar array 510 through the plurality of rows.

In FIG. 5A, the sub array SA includes 3×3 resistive memory cells CELL, but the number of resistive memory cells CELL is not limited to 3 and other number of resistive memory cells CELL can be included in the sub array SA.

Each resistive memory cell CELL may correspond to one synapse or connection of the neural network, and may store one weight data. Therefore, m×n data stored in the crossbar array 510 may correspond to the weight matrix implemented in the form of an m×n matrix included in one layer described above with reference to FIGS. 2A and 2B, for example, W of [Equation 1] described above.

The input voltages applied through the plurality of rows may correspond to the n inputs a1, a2, . . . , and an received in one layer shown in FIGS. 2A and 2B, and may correspond to the input matrix implemented in the form of an n×1 matrix, that is, A of Equation 1 described above.

The output currents output through the plurality of columns correspond to the m outputs z1, z2, . . . , and zm output from one layer shown in FIGS. 2A and 2B, and may correspond to the output matrix implemented in the form of an m×1 matrix, that is, Z of [Equation 1] described above.

As discussed above, the crossbar array 510 is implemented by storing the plurality of weight data having the matrix form in the plurality of resistive memory cells CELL. When the input voltages V1, V2, and V3 corresponding to the input data are input through the plurality of rows, the output currents I1, I2, and I3 output through the plurality of columns may be the result of the MAC operation performed by the neural network. When implementing all of the plurality of layers of the neural network in such a method, the electronic device 300 that performs data storage and operation at once may be implemented.

The plurality of current-to-voltage converters IVC may be connected between the crossbar array 510 and the plurality of analog-to-digital converters ADC. The plurality of current-to-voltage converters IVC may convert the plurality of output currents I1, I2, and I3 into a plurality of analog input signals I_SIG1, I_SIG2, and I_SIG3. In other words, the computing circuit 330 may perform an operation on the plurality of input voltages V1, V2, and V3 and the plurality of weight data using the crossbar array 510 and the plurality of current-to-voltage converters IVC, and may generate the analog input signals I_SIG1, I_SIG2, and I_SIG3 input to each of the plurality of analog-to-digital converters ADC based on a result of the operation. In FIG. 5A, the sub array SA includes three current-to-voltage converters IVC, but the number of current-to-voltage converters IVC is not limited to three and can include any other number of current-to-voltage converters IVC.

The plurality of analog-to-digital converters ADC may receive the analog input signals I_SIG1, I_SIG2, and I_SIG3, respectively, and output digital output signals O_SIG1, O_SIG2, O_SIG3 corresponding to the analog input signals I_SIG1, I_SIG2, and I_SIG3. In FIG. 5A, the sub array SA includes three analog-to-digital converters ADC, but the number of analog-to-digital converters ADC is not limited to three and other number of analog-to-digital converters ADC can be included in the sub array SA.

Figure 5B:
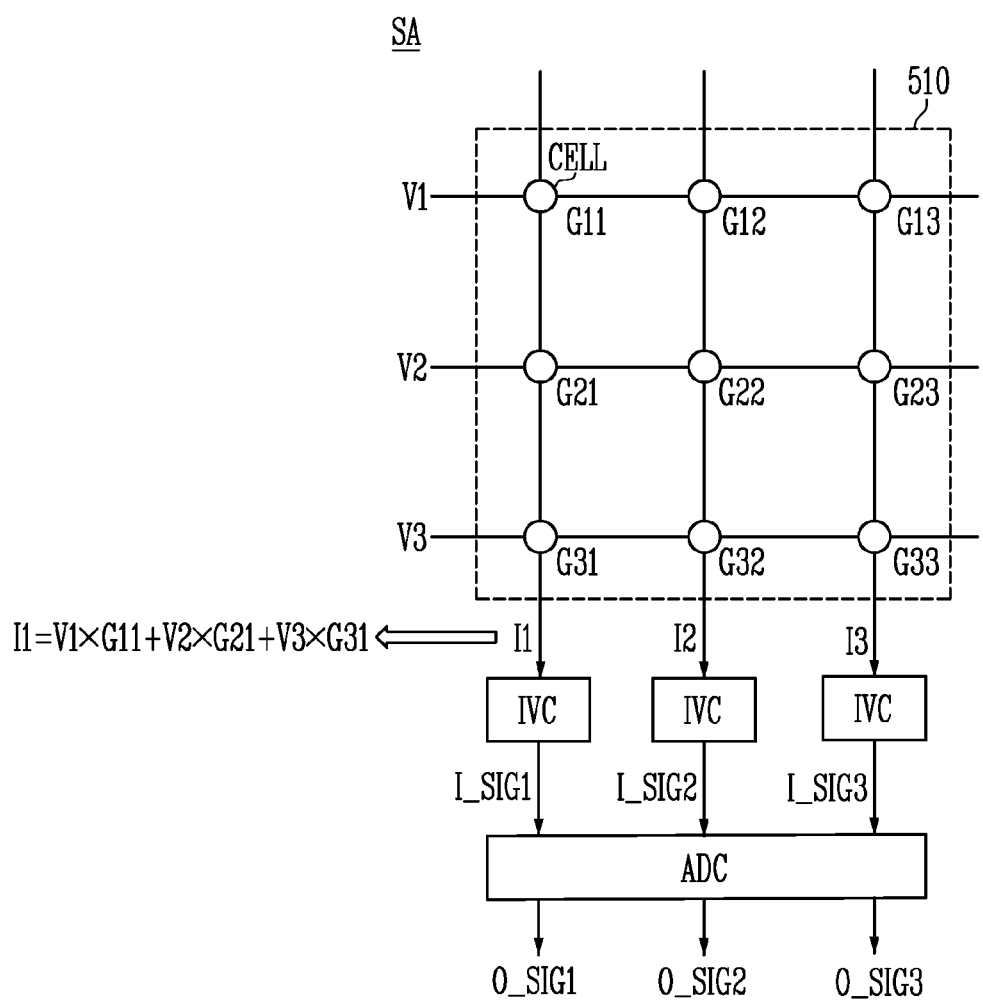
FIG. 5B is a diagram illustrating another example of a sub array according to an embodiment of the disclosed technology.

FIG. 5B is a diagram illustrating another example of a sub array according to an embodiment of the disclosed technology.

Referring to FIG. 5B, the sub array SA may include one analog-to-digital converter ADC. That is, according to an embodiment, the sub array SA may share one analog-to-digital converter ADC. In this case, the number of analog-to-digital converters ADC is reduced as compared to the implementation as shown in FIG. 5A. Thus, it is possible to reduce the area for the analog-to-digital converters ADC.

Figure 6:
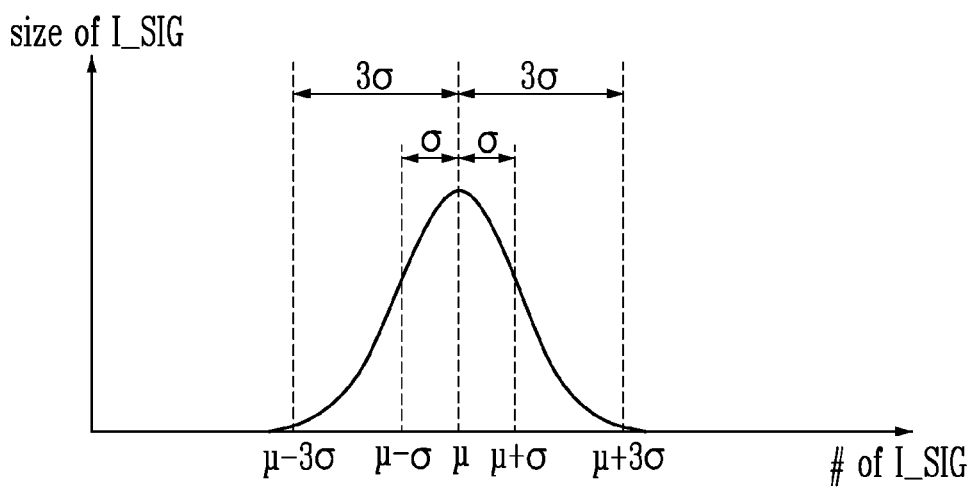
FIG. 6 is a diagram illustrating input signal distribution information according to an embodiment of the disclosed technology.

FIG. 6 is a diagram illustrating input signal distribution information according to an embodiment of the disclosed technology.

The input signal distribution information shown in FIG. 6 may indicate the input signal distribution information of any one of the plurality of analog-to-digital converters or the plurality of default analog-to-digital converter groups.

In FIG. 6, a vertical axis may indicate the size of the analog input signals, and a horizontal axis may indicate the number of analog input signals.

Referring to FIG. 6, the input signal distribution information generator 311 may generate the input signal distribution information of the plurality of analog-to-digital converters by using the 3 sigma technique. For example, the input signal distribution information may be generated based on an average p and a standard deviation a of the plurality of analog input signals. In an embodiment, the 3 sigma technique may be a rule for forming a normal distribution using values that fall within a range of 3 standard deviations $3a$ from the average p to both sides. A distribution range corresponding to the input signal distribution information may be determined as a range from $\mu-3\sigma$ to $\mu+3\sigma$.

In an embodiment, the size value corresponding to the input signal distribution information may be expressed as $\mu+3\sigma$. However, according to an embodiment, the size value corresponding to the input signal distribution information may be set to a value other than $\mu+3\sigma$.

Figure 7A:
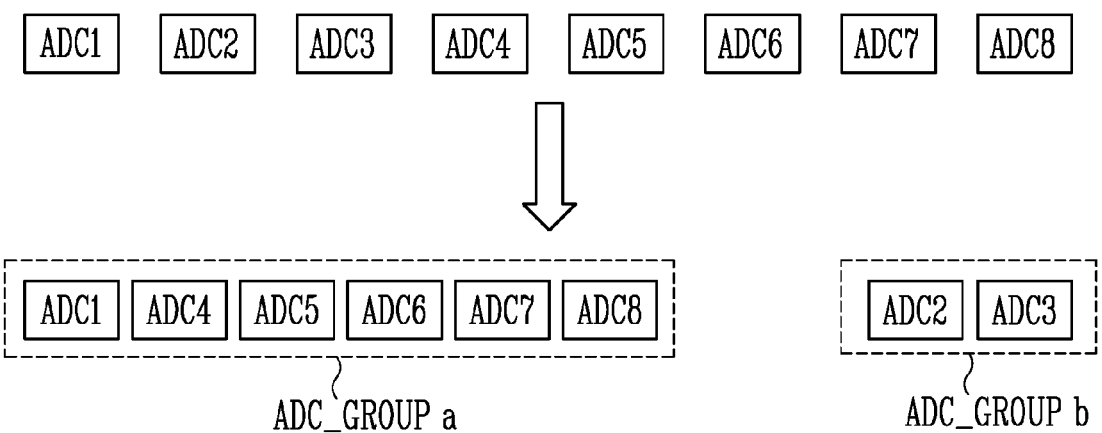
FIG. 7A is a diagram illustrating an operation of classifying a plurality of analog-to-digital converters into a plurality of first analog-to-digital converter groups according to an embodiment of the disclosed technology.

FIG. 7A is a diagram illustrating an operation of classifying a plurality of analog-to-digital converters into a plurality of first analog-to-digital converter groups according to an embodiment of the disclosed technology.

In FIG. 7A, for convenience of description, it is assumed that the number of analog-to-digital converters is eight, and the analog-to-digital converters are classified into two first analog-to-digital converter groups. However, according to an embodiment, the number of analog-to-digital converters and the number of first analog-to-digital converter groups may be various.

Referring to FIG. 7A, the analog-to-digital converter group classifier 312 may classify a plurality of analog-to-digital converters ADC1 to ADC8 into a plurality of first analog-to-digital converter groups ADC_GROUP a and ADC_GROUP b based on input signal distribution information of the analog-to-digital converters ADC1 to ADC8.

For example, the first analog-to-digital converter ADC1, the fourth analog-to-digital converter ADC4, the fifth analog-to-digital converter ADC5, the sixth analog-to-digital converter ADC6, the seventh analog-to-digital converter ADC7, and the eighth analog-to-digital converter ADC8 may have similar size values corresponding to the input signal distribution information. In this case, the analog-to-digital converter group classifier 312 may classify the first analog-to-digital converter ADC1, the fourth analog-to-digital converter ADC4, the fifth analog-to-digital converter ADC5, the sixth analog-to-digital converter ADC6, the seventh analog-to-digital converter ADC7, and the eighth analog-to-digital converter ADC8 into the a-th analog-to-digital converter group ADC_GROUP a.

In addition, the second analog-to-digital converter ADC2 and the third analog-to-digital converter ADC3 may have similar size values corresponding to the input signal distribution information. In this case, the analog-to-digital converter group classifier 312 may classify the second analog-to-digital converter ADC2 and the third analog-to-digital converter ADC3 into the b-th analog-to-digital converter group ADC_GROUP b.

Meanwhile, the operation shown in FIG. 7A may be equally applied when reclassifying the plurality of analog-to-digital converters into the plurality of second analog-to-digital converter groups. For example, when reclassifying after increasing the number of groups, the analog-to-digital converter group classifier 312 may reclassify the plurality of analog-to-digital converters ADC1 to ADC8 into three or more second analog-to-digital converter groups. As another example, when reclassifying after increasing the number of output bits of the analog-to-digital converter, the analog-to-digital converter group classifier 312 may reclassify the plurality of analog-to-digital converters ADC1 to ADC8 into three or more second analog-to-digital converter groups according to the increased number of output bits.

FIG. 7B is a diagram illustrating an operation of classifying a plurality of default analog-to-digital converter groups into a plurality of first analog-to-digital converter groups according to an embodiment of the disclosed technology.

Differently from the diagram shown in FIG. 7A, the diagram shown in FIG. 7B is a diagram for describing an operation of classifying a plurality of analog-to-digital converters into a plurality of default analog-to-digital converter groups DEFAULT GROUP1 to DEFAULT GROUP8, and then classifying the plurality of default analog-to-digital converter groups DEFAULT GROUP1 to DEFAULT GROUP8 into a plurality of first analog-to-digital converter groups ADC_GROUP c and ADC_GROUP d. At this time, each of the default analog-to-digital converter groups DEFAULT GROUP1 to DEFAULT GROUP8 may include a plurality of analog-to-digital converters. For example, each of the plurality of default analog-to-digital converter groups DEFAULT GROUP1 to DEFAULT GROUP8 may correspond to a layer unit or a hardware unit.

In FIG. 7B, for convenience of description, it is assumed that the number of default analog-to-digital converter groups is eight, and the default analog-to-digital converter groups is classified into two first analog-to-digital converter groups. However, according to an embodiment, the number of default analog-to-digital converter groups and the number of first analog-to-digital converter groups may be various.

Referring to FIG. 7B, the analog-to-digital converter group classifier 312 may classify the plurality of default analog-to-digital converter groups DEFAULT GROUP1 to DEFAULT GROUP8 into the plurality of first analog-todigital converter groups ADC_GROUP c and ADC_GROUP d based on input signal distribution information of the default analog-to-digital converter groups DEFAULT GROUP1 to DEFAULT GROUP8.

For example, the first default analog-to-digital converter group DEFAULT GROUP1, the fourth default analog-to-digital converter group DEFAULT GROUP4, the fifth default analog-to-digital converter group DEFAULT GROUP5, the sixth default analog-to-digital converter group DEFAULT GROUP6, the seventh default analog-to-digital converter group DEFAULT GROUP7, and the eighth default analog-to-digital converter group DEFAULT GROUP8 may have similar size values corresponding to the input signal distribution information. In this case, the analog-to-digital converter group classifier 312 may classify the first default analog-to-digital converter group DEFAULT GROUP1, the fourth default analog-to-digital converter group DEFAULT GROUP4, the fifth default analog-to-digital converter group DEFAULT GROUP5, the sixth default analog-to-digital converter group DEFAULT GROUP6, the seventh default analog-to-digital converter group DEFAULT GROUP7, and the eighth default analog-to-digital converter group DEFAULT GROUP8 into the c-th analog-to-digital converter group ADC_GROUP c.

In addition, the second default analog-to-digital converter group DEFAULT GROUP2 and the third default analog-to-digital converter group DEFAULT GROUP3 may have similar size values corresponding to the input signal distribution information. In this case, the analog-to-digital converter group classifier 312 may classify the second default analog-to-digital converter group DEFAULT GROUP2 and the third default analog-to-digital converter group DEFAULT GROUP3 into the d-th analog-to-digital converter group ADC_GROUP d.

Meanwhile, the operation shown in FIG. 7B may be equally applied when reclassifying the plurality of default analog-to-digital converter groups into the plurality of second analog-to-digital converter groups. For example, when reclassifying after increasing the number of groups, the analog-to-digital converter group classifier 312 may reclassify the plurality of default analog-to-digital converter groups DEFAULT GROUP1 to DEFAULT GROUP8 into three or more second analog-to-digital converter groups. As another example, when reclassifying after increasing the number of output bits of the analog-to-digital converter, the analog-to-digital converter group classifier 312 may reclassify the plurality of default analog-to-digital converter groups DEFAULT GROUP1 to DEFAULT GROUP8 into three or more second analog-to-digital converter groups according to the increased number of output bits.

In an embodiment, the operations shown in FIGS. 7A and 7B may be performed using the clustering technique.

Figure 8A:
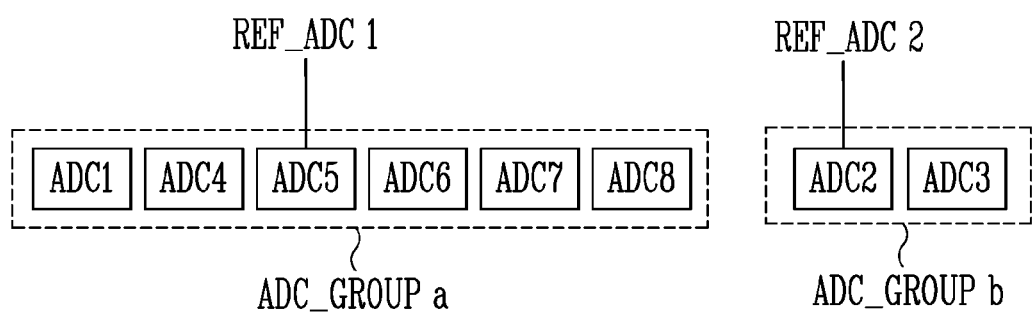
FIG. 8A is a diagram illustrating an example of an operation of determining an input range of each of a plurality of first analog-to-digital converter groups according to an embodiment of the disclosed technology.

FIG. 8A is a diagram illustrating an example of an operation of determining an input range of each of a plurality of first analog-to-digital converter groups according to an embodiment of the disclosed technology.

The plurality of first analog-to-digital converter groups ADC_GROUP a and ADC_GROUP b of FIG. 8A may indicate the plurality of first analog-to-digital converter groups ADC_GROUP a and ADC_GROUP b of FIG. 7A.

In FIG. 8A, it is assumed that the size value corresponding to the input signal distribution information of the fifth analog-to-digital converter ADC5 among the analog-to-digital converters ADC1, ADC4, ADC5, ADC6, ADC7, and ADC8 included in the a-th analog-to-digital converter group ADC_GROUP a is the largest. In an embodiment, the size value corresponding to the input signal distribution infor-mation may indicate a sum of the average and 3×standard deviation of the analog input signals.

The fifth analog-to-digital converter ADC5 may be determined as a reference analog-to-digital converter REF_ADC 1 of the a-th analog-to-digital converter group ADC_GROUP a. In this case, the analog-to-digital converter input range optimizer 313 may determine a distribution range corresponding to the input signal distribution information of the fifth analog-to-digital converter ADC5 as an input range of the a-th analog-to-digital converter group ADC_GROUP a. In an embodiment, the distribution range corresponding to the input signal distribution information may indicate a range from an average−3×standard deviation of the analog input signals to an average+3×standard deviation. Therefore, an input range of the analog-to-digital converters ADC1, ADC4, ADC6, ADC7, and ADC8 included in the a-th analog-to-digital converter group ADC_GROUP a may be optimized to the distribution range corresponding to the input signal distribution information of the fifth analog-to-digital converter ADC5. The analog-to-digital converters ADC1, ADC4, ADC5, ADC6, ADC7, and ADC8 may operate according to the optimized input range.

It is assumed that the size value corresponding to the input signal distribution information of the second analog-to-digital converter ADC2 among the analog-to-digital converters ADC2 and ADC3 included in the b-th analog-to-digital converter group ADC_GROUP b is the largest.

The second analog-to-digital converter ADC2 may be determined as a reference analog-to-digital converter REF_ADC2 of the b-th analog-to-digital converter group ADC_GROUP b. In this case, the analog-to-digital converter input range optimizer 313 may determine a distribution range corresponding to the input signal distribution information of the second analog-to-digital converter ADC2 as an input range of the b-th analog-to-digital converter group ADC_GROUP b. Therefore, the input range of the analog-to-digital converter ADC3 included in the b-th analog-to-digital converter group ADC_GROUP b may be optimized to a distribution range corresponding to the input signal distribution information of the second analog-to-digital converter ADC2. The analog-to-digital converters ADC2 and ADC3 may operate according to the optimized input range.

Meanwhile, the operation shown in FIG. 8A may be equally applied when determining the input range of each of the plurality of second analog-to-digital converter groups.

Figure 8B:
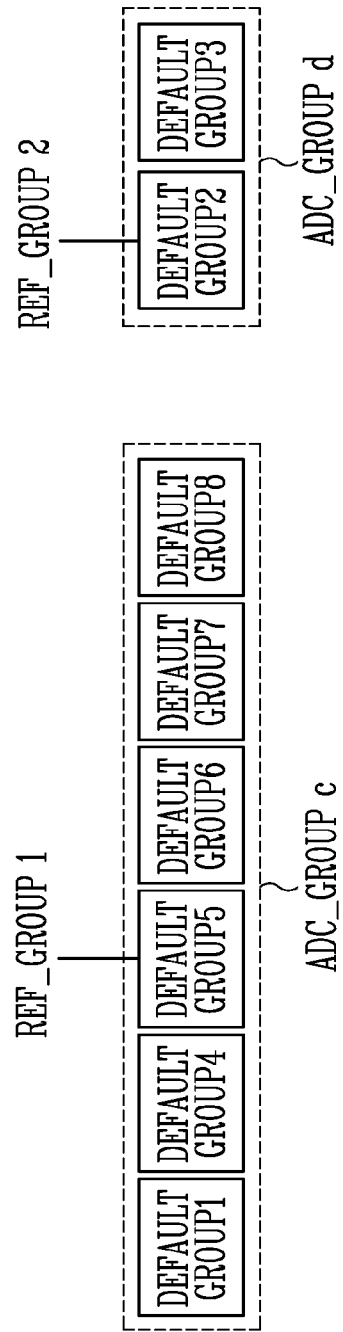
FIG. 8B is a diagram illustrating another example of an operation of determining an input range of each of a plurality of first analog-to-digital converter groups according to an embodiment of the disclosed technology.

FIG. 8B is a diagram illustrating another example of an operation of determining an input range of each of a plurality of first analog-to-digital converter groups according to an embodiment of the disclosed technology.

The plurality of first analog-to-digital converter groups ADC_GROUP c and ADC_GROUP d of FIG. 8B may indicate the plurality of first analog-to-digital converter groups ADC_GROUP c and ADC_GROUP d of FIG. 7B.

In FIG. 8B, it is assumed that a size value corresponding to input signal distribution information of the fifth default analog-to-digital converter group DEFAULT GROUP5 among the default analog-to-digital converter groups DEFAULT GROUP1, DEFAULT GROUP4, DEFAULT GROUP5, DEFAULT GROUP6, DEFAULT GROUP7, and DEFAULT GROUP8 included in the c-th analog-to-digital converter group ADC_GROUP c is the largest.

The fifth default analog-to-digital converter group DEFAULT GROUP5 may be determined as a reference default analog-to-digital converter group REF_GROUP 1 of the c-th analog-to-digital converter group ADC_GROUP c. In this case, the analog-to-digital converter input range optimizer 313 may determine a distribution range corresponding to the input signal distribution information of the fifth default analog-to-digital converter group DEFAULT GROUP5 as an input range of the c-th analog-to-digital converter group ADC_GROUP c. Therefore, an input range of the analog-to-digital converters included in the default analog-to-digital converter groups DEFAULT GROUP1, DEFAULT GROUP4, DEFAULT GROUP6, DEFAULT GROUP7, and DEFAULT GROUP8 may be optimized to the distribution range corresponding to the signal distribution information of the fifth default analog-to-digital converter group DEFAULT GROUP5. The analog-to-digital converters included in the default analog-to-digital converter groups DEFAULT GROUP1, DEFAULT GROUP4, DEFAULT GROUP5, DEFAULT GROUP6, DEFAULT GROUP7, and DEFAULT GROUP8 may operate according to the optimized input range.

It is assumed that a size value corresponding to input signal distribution information of the second default analog-to-digital converter group DEFAULT GROUP2 among the default analog-to-digital converter groups DEFAULT GROUP2 and DEFAULT GROUP3 included in the d-th analog-to-digital converter group ADC_GROUP d is the largest.

The second default analog-to-digital converter group DEFAULT GROUP2 may be determined as a reference default analog-to-digital converter group REF_GROUP2 of the d-th analog-to-digital converter group ADC_GROUP d. In this case, the analog-to-digital converter input range optimizer 313 may determine a distribution range corresponding to the input signal distribution information of the second default analog-to-digital converter group DEFAULT GROUP2 as an input range of the d-th analog-to-digital converter group ADC_GROUP d. Therefore, an input range of the analog-to-digital converters included in the default analog-to-digital converter group DEFAULT GROUP3 may be optimized to a distribution range corresponding to the input signal distribution information of the second default analog-to-digital converter group DEFAULT GROUP2. The analog-to-digital converters included in the default analog-to-digital converter groups DEFAULT GROUP2 and DEFAULT GROUP3 may operate according to the optimized input range.

Meanwhile, the operation shown in FIG. 8B may be equally applied when determining the input range of each of the plurality of second analog-to-digital converter groups.

Figure 9:
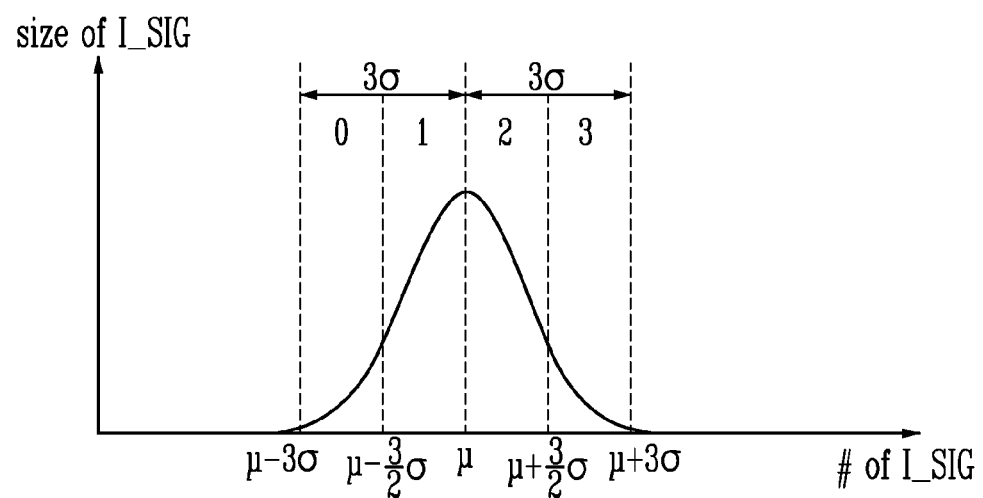
FIG. 9 is a diagram illustrating an operation of optimizing an input range of an analog-to-digital converter according to an embodiment of the disclosed technology.

FIG. 9 is a diagram illustrating an operation of optimizing an input range of an analog-to-digital converter according to an embodiment of the disclosed technology.

In FIG. 9, it is assumed that the number of output bits of the analog-to-digital converter is two bits.

The diagram shown in FIG. 9 may indicate input signal distribution information of the reference analog-to-digital converter. Meanwhile, although the input signal distribution of the analog-to-digital converter is described with reference to FIG. 9 for convenience of description, the input signal distribution of the default analog-to-digital converter group may be equally applied.

Referring to FIG. 9, a distribution range corresponding to the input signal distribution information of the reference analog-to-digital converter may be defined as $\mu-3\sigma$ to $\mu+3\sigma$. In this case, the analog-to-digital converter input range optimizer 313 may optimize the input range of the analog-to-digital converters by linearly dividing the distribution range corresponding to the input signal distribution information. For example, the analog-to-digital converter of which the input range is optimized may output a digital output signal (for example, 00) corresponding to 0 with respect to analog input signals from $\mu-3\sigma$ to $\mu-(3/2)\sigma$ within the distribution range. As another example, the analog-to-digital converter of which the input range is optimized may output a digital output signal (for example, 01) corresponding to 1 with respect to analog input signals from $\mu-(3/2)\sigma$ to $\mu$ within the distribution range. As still another example, the analog-to-digital converter of which the input range is optimized may output a digital output signal (for example, 10) corresponding to 2 with respect to analog input signals from p to $\mu+(3/2)\sigma$ within the distribution range. As still another example, the analog-to-digital converter of which the input range is optimized may output a digital output signal (for example, 11) corresponding to 3 with respect to analog input signals from $\mu+(3/2)\sigma$ to $\mu+3\sigma$ within the distribution range.

Figure 10:
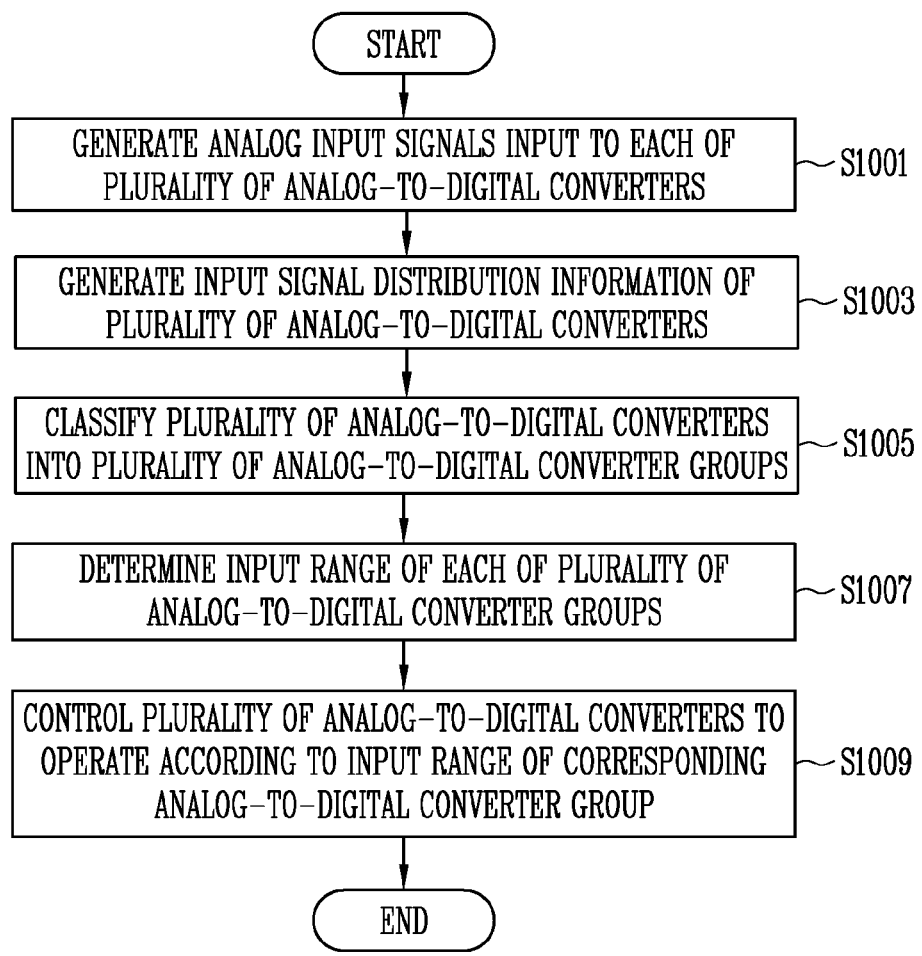
FIG. 10 is a flowchart illustrating a method of operating an electronic device for optimizing an input range of an analog-to-digital converter according to an embodiment of the disclosed technology.

FIG. 10 is a flowchart illustrating a method of operating an electronic device for optimizing an input range of an analog-to-digital converter according to an embodiment of the disclosed technology.

The method shown in FIG. 10 may be performed, for example, by the electronic device 300 shown in FIG. 3.

In step S1001, the electronic device 300 may generate the analog input signals input to each of the plurality of analog-to-digital converters based on the operation on the plurality of input voltages and the plurality of weight data.

In some implementations, the electronic device 300 may perform the MAC operation on the plurality of input voltages and the plurality of weight data. In addition, the electronic device 300 may output the plurality of output currents according to the result of the operation. In addition, the electronic device 300 may convert the plurality of output currents into the analog input signals.

In step S1003, the electronic device 300 may generate the input signal distribution information of the plurality of analog-to-digital converters.

In some implementations, the electronic device 300 may calculate the average and the standard deviation of the analog input signals. In addition, the electronic device 300 may generate the input signal distribution information of the plurality of analog-to-digital converters using the average and the standard deviation.

In step S1005, the electronic device 300 may classify the plurality of analog-to-digital converters into the plurality of analog-to-digital converter groups based on the input signal distribution information of the plurality of analog-to-digital converters.

In some implementations, the electronic device 300 may determine the analog-to-digital converters having the similar size values corresponding to the input signal distribution information among the plurality of analog-to-digital converters as any one first analog-to-digital converter group among the plurality of first analog-to-digital groups. For example, the electronic device 300 may classify analog-to-digital converters into the plurality of first analog-to-digital converter groups using the clustering technique.

In step S1007, the electronic device 300 may determine the input range of each of the plurality of first analog-to-digital converter groups based on the input signal distribution information of the plurality of analog-to-digital converters.

In some implementations, in each of the plurality of first analog-to-digital converter groups, the electronic device 300 may determine the analog-to-digital converter having the largest value corresponding to the input signal distribution information among the analog-to-digital converters included in each of the plurality of first analog-to-digital converter groups as the reference analog-to-digital converter.

In addition, the electronic device 300 may determine the distribution range corresponding to the input signal distribution information of the reference analog-to-digital converter determined in each of the plurality of first analog-to-digital converter groups as the input range of each of the plurality of first analog-to-digital converter groups.

In step S1009, the electronic device 300 may control the plurality of analog-to-digital converters to operate according to the input range of the corresponding analog-to-digital converter group among the plurality of analog-to-digital converter groups.

Figure 11:
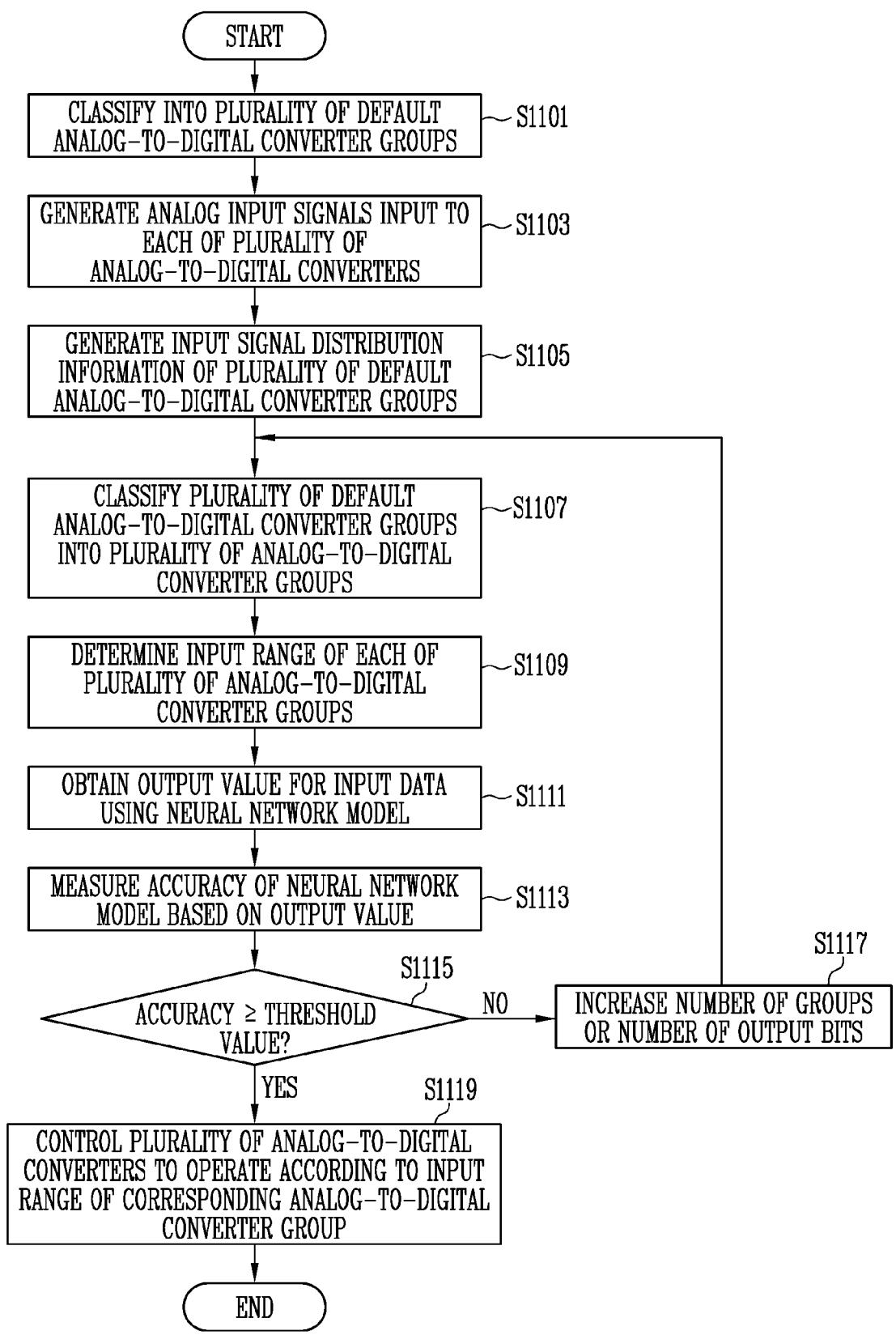
FIG. 11 is a flowchart illustrating a method of operating an electronic device for optimizing an input range of an analog-to-digital converter according to an additional embodiment of the disclosed technology.

FIG. 11 is a flowchart illustrating a method of operating an electronic device for optimizing an input range of an analog-to-digital converter according to an additional embodiment of the disclosed technology.

The method shown in FIG. 11 may be performed, for example, by the electronic device 300 shown in FIG. 3.

In step S1101, the electronic device 300 may classify the plurality of analog-to-digital converters into the plurality of default analog-to-digital converter groups.

In step S1103, the electronic device 300 may generate the analog input signals input to each of the plurality of analog-to-digital converters based on the operation on the plurality of input voltages and the plurality of weight data.

In some implementations, the electronic device 300 may perform the MAC operation on the plurality of input voltages and the plurality of weight data. In addition, the electronic device 300 may output the plurality of output currents according to the result of the operation. In addition, the electronic device 300 may convert the plurality of output currents into the analog input signals.

In step S1105, the electronic device 300 may generate the input signal distribution information of the plurality of default analog-to-digital converter groups using the analog input signals input to the analog-to-digital converters included in each of the plurality of default analog-to-digital converter groups.

In some implementations, the electronic device 300 may calculate the average and the standard deviation of the analog input signals. In addition, the electronic device 300 may generate the input signal distribution information of the plurality of default analog-to-digital converter groups using the average and the standard deviation.

In step S1107, the electronic device 300 may classify the plurality of default analog-to-digital converter groups into the plurality of analog-to-digital converter groups based on the input signal distribution information of the plurality of default analog-to-digital converter groups.

In some implementations, the electronic device 300 may determine the default analog-to-digital converter groups having the similar size values corresponding to each of the input signal distribution information among the plurality of default analog-to-digital converter groups as any one analog-to-digital converter group among the plurality of analog-to-digital groups. For example, the electronic device 300 may classify the plurality of default analog-to-digital converter groups into the plurality of analog-to-digital converter groups using the clustering technique.

In step S1109, the electronic device 300 may determine the input range of each of the plurality of analog-to-digital converter groups based on the input signal distribution information of the plurality of default analog-to-digital converter groups.

In some implementations, in each of the plurality of analog-to-digital converter groups, the electronic device 300 may determine the default analog-to-digital converter group having the largest value corresponding to the input signal distribution information among the default analog-to-digital converter groups included in each of the plurality of analog-to-digital converter groups as the reference default analog-to-digital converter group.

In addition, the electronic device 300 may determine the distribution range corresponding to the input signal distribution information of the reference default analog-to-digital converter group determined in each of the plurality of analog-to-digital converter groups as the input range of each of the plurality of analog-to-digital converter groups.

In step S1111, the electronic device 300 may obtain the output value for the input data using the neural network model including the plurality of analog-to-digital converters controlled to operate according to the determined input range.

In step S1113, the electronic device 300 may measure the accuracy of the neural network model based on the output value.

In step S1115, the electronic device 300 may determine whether the accuracy is equal to or greater than the preset threshold value.

When the accuracy is less than the preset threshold according to a result of the determination in step S1115, step S1117 may be performed. In step S1117, the electronic device 300 may increase the number of groups to be configured of the plurality of analog-to-digital converters or the number of output bits of the plurality of analog-to-digital converters. Thereafter, the electronic device 300 may perform step S1107 again according to the increased number of groups or the increased number of output bits. Thus, the electronic device 300 may perform steps S1107, S1109, and S1111 again while increasing the number of groups or the number of output bits until the accuracy becomes equal to or greater than the preset threshold value. Meanwhile, the analog-to-digital converter group before reclassification may be referred to as the first analog-to-digital converter group, and the reclassified analog-to-digital converter group may be referred to as the second analog-to-digital converter group.

On the other hand, when the accuracy is equal to or greater than the preset threshold according to the result of the determination in step S1115, step S1119 may be performed. In step S1119, the electronic device 300 may control the plurality of analog-to-digital converters to operate according to the input range of the corresponding analog-to-digital converter group among the plurality of analog-to-digital converter groups.

Only examples of embodiments of the disclosed technology are described. Various modifications and improvements to the disclosed embodiments and other embodiments can be made based on what is described or illustrated in this patent document.

What is claimed is:

1. An electronic device comprising:
a plurality of analog-to-digital converters each configured to receive an analog input signal and output a digital output signal corresponding to the analog input signal;
an analog input signal generator configured to generate analog input signals provided to each of the plurality of analog-to-digital converters based on an operation on a plurality of input voltages and a plurality of weight data;
an input signal distribution information generator configured to calculate an average and a standard deviation of the analog input signals, and generate input signal distribution information indicating a distribution of the analog input signals for each of the plurality of analog-to-digital converters using the average and the standard deviation;

an analog-to-digital converter group classifier configured to classify the plurality of analog-to-digital converters into a plurality of first analog-to-digital converter groups based on the input signal distribution information of the plurality of analog-to-digital converters; and an analog-to-digital converter input range optimizer configured to determine an input range of each of the plurality of first analog-to-digital converter groups based on the input signal distribution information of the plurality of analog-to-digital converters, wherein each of the plurality of analog-to-digital converters is configured to operate according to an input range of a corresponding first analog-to-digital converter group among the plurality of first analog-to-digital converter groups.

2. The electronic device of claim 1, wherein the analog input signal generator comprises:

an array including a plurality of resistive memory cells storing the plurality of weight data and configured to receive the plurality of input voltages and the plurality of weight data, perform multiplication and accumulation operations using the plurality of input voltages and the plurality of weight data, and output a plurality of output currents according to results of the operations; and a current-to-voltage converter disposed between the array and the plurality of analog-to-digital converters and configured to convert the plurality of output currents into the analog input signals.

3. The electronic device of claim 1, wherein the input signal distribution information generator is configured to generate the input signal distribution information of the plurality of analog-to-digital converters using a 3 sigma technique.

4. The electronic device of claim 1, wherein the analog-to-digital converter group classifier is configured to classify analog-to-digital converters having similar size values corresponding to the input signal distribution information as one of the plurality of first analog-to-digital converter groups.

5. The electronic device of claim 4, wherein the analog-to-digital converter group classifier is configured to classify the analog-to-digital converters into the plurality of first analog-to-digital converter groups using a clustering technique.

6. The electronic device of claim 1, wherein the analog-to-digital converter input range optimizer is configured to determine any one of analog-to-digital converters included in each of the plurality of first analog-to-digital converter groups as a reference analog-to-digital converter, and determine a distribution range corresponding to input signal distribution information of the reference analog-to-digital converter as an input range of each of the plurality of first analog-to-digital converter groups.

7. The electronic device of claim 6, wherein the reference analog-to-digital converter is an analog-to-digital converter having a largest size value corresponding to the input signal distribution information among the analog-to-digital converters included in each of the plurality of first analog-to-digital converter groups.

8. The electronic device of claim 1, wherein the analog-to-digital converter group classifier is configured to classify the plurality of analog-to-digital converters into a plurality of default analog-to-digital converter groups.

9. The electronic device of claim 8, wherein each of the plurality of default analog-to-digital converter groups corresponds to a layer unit or a hardware unit.

10. The electronic device of claim 8, wherein the input signal distribution information generator is configured to generate input signal distribution information of the plurality of default analog-to-digital converter groups based on analog input signals input to analog-to-digital converters included in each of the plurality of default analog-to-digital converter groups, wherein the analog-to-digital converter group classifier is configured to classify the plurality of default analog-to-digital converter groups into the plurality of first analog-to-digital converter groups based on the input signal distribution information of the plurality of default analog-to-digital converter groups, and wherein the analog-to-digital converter input range optimizer determines an input range of each of the plurality of first analog-to-digital converter groups based on the input signal distribution information of the plurality of default analog-to-digital converter groups.

11. The electronic device of claim 1, further comprising:

a neural network model controller configured to obtain an output value for input data using a neural network model that is configured to apply to the plurality of analog-to-digital converters, each operating according to the input range of the corresponding first analog-to-digital converter group; and a neural network model accuracy measurer configured to measure accuracy of the neural network model based on the output value.

12. The electronic device of claim 11, wherein the analog-to-digital converter group classifier is configured to increase the number of groups to which the plurality of analog-to-digital converters are classified or the number of output bits of the plurality of analog-to-digital converters, in response to the accuracy being less than a preset threshold value.

13. A method of operating an electronic device, the method comprising:

classifying a plurality of analog-to-digital converters into a plurality of default analog-to-digital converter groups;

generating analog input signals for the plurality of analog-to-digital converters using an operation based on a plurality of input voltages and a plurality of weight data;

calculating an average and a standard deviation of the analog input signals;

generating input signal distribution information of the plurality of default analog-to-digital converter groups based on the analog input signals using the average and the standard deviation;

classifying the plurality of default analog-to-digital converter groups into a plurality of first analog-to-digital converter groups based on the input signal distribution information of the plurality of default analog-to-digital converter groups;

determining an input range of each of the plurality of first analog-to-digital converter groups based on the input signal distribution information of the plurality of default analog-to-digital converter groups; and controlling the plurality of analog-to-digital converters to operate according to an input range of a corresponding first analog-to-digital converter group among the plurality of first analog-to-digital converter groups.

14. The method of claim 13, wherein the generating of the analog input signals comprises:
- performing multiplication and accumulation operations on the plurality of input voltages and the plurality of weight data;
- outputting a plurality of output currents according to a result of the multiplication and accumulation operations; and
- converting the plurality of output currents into the analog input signals.

15. The method of claim 13, wherein the classifying into the plurality of first analog-to-digital converter groups comprises determining default analog-to-digital converters having similar size values corresponding to the input signal distribution information as one of the plurality of first analog-to-digital converter groups.

16. The method of claim 15, wherein the classifying into the plurality of first analog-to-digital converter groups comprises classifying the plurality of default analog-to-digital converter groups into the plurality of first analog-to-digital converter groups using a clustering technique.

17. The method of claim 13, wherein the determining of the input range comprises:
- determining a default analog-to-digital converter group having a largest value corresponding to the input signal distribution information among default analog-to-digital converter groups included in each of the plurality of first analog-to-digital converter groups as a reference default analog-to-digital converter group in each of the plurality of first analog-to-digital converter groups; and
- determining a distribution range corresponding to input signal distribution information of the reference default analog-to-digital converter group determined in each of the plurality of first analog-to-digital converter groups as the input range of each of the plurality of first analog-to-digital converter groups.

18. The method of claim 13, further comprising:
- obtaining an output value for input data using a neural network model that is configured to apply to the plurality of analog-to-digital converters controlled to operate according to the determined input range;
- measuring accuracy of the neural network model based on the output value;
- increasing the number of groups to which the plurality of analog-to-digital converters are classified or the number of output bits of the plurality of analog-to-digital converters, in response to the accuracy being less than a preset threshold value.

19. A method of operating an electronic device, the method comprising:
- classifying a plurality of analog-to-digital converters into a plurality of default analog-to-digital converter groups;
- generating analog input signals for the plurality of analog-to-digital converters using an operation based on a plurality of input voltages and a plurality of weight data;
- generating input signal distribution information of the plurality of default analog-to-digital converter groups based on the analog input signals;
- classifying the plurality of default analog-to-digital converter groups into a plurality of first analog-to-digital converter groups based on the input signal distribution information of the plurality of default analog-to-digital converter groups;
- determining an input range of each of the plurality of first analog-to-digital converter groups based on the input signal distribution information of the plurality of default analog-to-digital converter groups; and
- controlling the plurality of analog-to-digital converters to operate according to an input range of a corresponding first analog-to-digital converter group among the plurality of first analog-to-digital converter groups, wherein the method further comprises:
- obtaining an output value for input data using a neural network model that is configured to apply to the plurality of analog-to-digital converters controlled to operate according to the determined input range;
- measuring accuracy of the neural network model based on the output value;
- increasing the number of groups to which the plurality of analog-to-digital converters are classified or the number of output bits of the plurality of analog-to-digital converters, in response to the accuracy being less than a preset threshold value.

20. The method of claim 19, wherein the generating of the analog input signals comprises:
- performing multiplication and accumulation operations on the plurality of input voltages and the plurality of weight data;
- outputting a plurality of output currents according to a result of the multiplication and accumulation operations; and
- converting the plurality of output currents into the analog input signals.

* * * * *